(12) United States Patent
Leuschner et al.

(10) Patent No.: US 9,979,375 B2
(45) Date of Patent: May 22, 2018

(54) MULTI-HARMONIC MATCHING NETWORKS

(71) Applicant: Intel IP Corporation, Santa Clara, CA (US)

(72) Inventors: Stephan Leuschner, Munich (DE); Jose Pedro Diogo Faisca Moreira, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 19 days.

(21) Appl. No.: 14/978,231

(22) Filed: Dec. 22, 2015

(65) Prior Publication Data

US 2017/0179917 A1  Jun. 22, 2017

(51) Int. Cl.
| H03H 7/38 | (2006.01) |
| H03H 7/01 | (2006.01) |
| H01F 27/28 | (2006.01) |
| H01L 23/64 | (2006.01) |
| H04B 1/04 | (2006.01) |

(52) U.S. Cl.
CPC ........... *H03H 7/38* (2013.01); *H01F 27/2804* (2013.01); *H01L 23/645* (2013.01); *H04B 1/0458* (2013.01)

(58) Field of Classification Search
CPC ........ H03H 7/38; H03H 7/0138; H03H 7/038; H01F 27/2804; H01L 23/645; H04B 1/0458
USPC ....................................................... 333/17.3
See application file for complete search history.

(56) References Cited

U.S. PATENT DOCUMENTS

| 2010/0109806 A1* | 5/2010 | Kim ........................ H03F 3/211 |
| | | 333/177 |
| 2011/0279184 A1 | 11/2011 | Chan et al. |
| 2012/0244802 A1 | 9/2012 | Feng et al. |
| 2014/0285286 A1* | 9/2014 | Bojer ................... H03H 7/0153 |
| | | 333/174 |
| 2016/0248453 A1* | 8/2016 | Matsuno .............. H04B 1/0475 |

OTHER PUBLICATIONS

International Search Report & Written Opinion of the International Searching Authority dated Feb. 23, 2017 for PCT Application No. PCT/US2016/063234.

* cited by examiner

*Primary Examiner* — Stephen E Jones
*Assistant Examiner* — Scott S Outten
(74) *Attorney, Agent, or Firm* — Eschweiler & Potashnik, LLC

(57) ABSTRACT

A communication matching network for multi-harmonic suppression includes a communication circuit configured to provide a signal. The communication matching network further includes a matching circuit configured to receive the signal from the communication circuit and suppress one or more harmonics of the received signal to generate a filtered signal, wherein the matching circuit includes a transformer comprising a first winding and a second winding, wherein the first winding includes a first inductance and the second winding includes a second inductance and wherein the matching network includes a harmonic trap including a third inductance such that the third inductance is located inside or within a physical layout of the first winding and/or the second winding. The communication matching network further includes a receiver circuit configured to receive the filtered signal from the matching circuit for further processing.

19 Claims, 13 Drawing Sheets

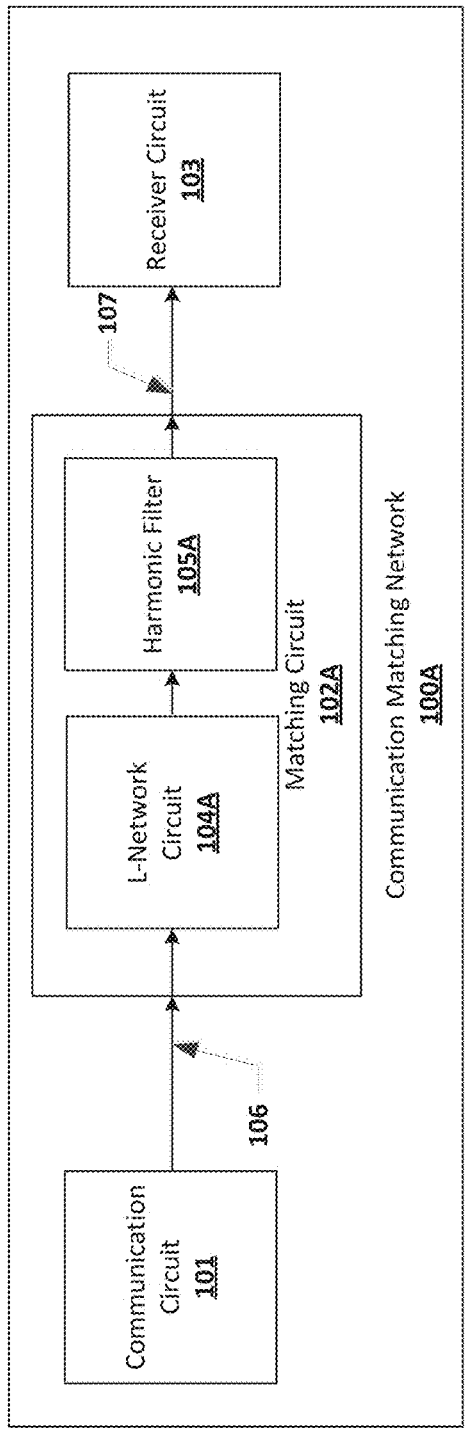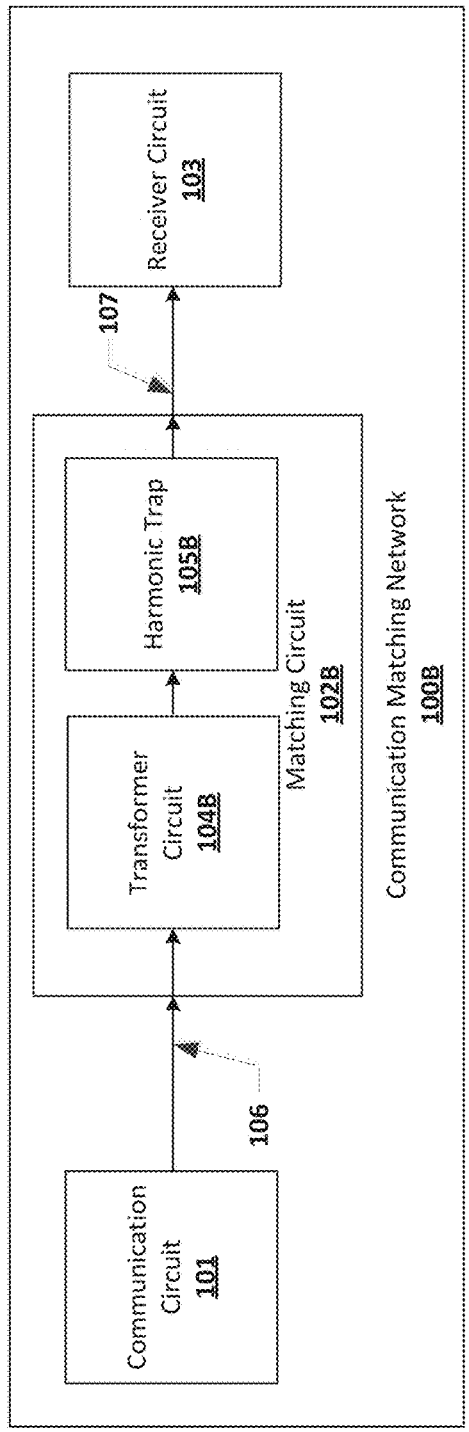

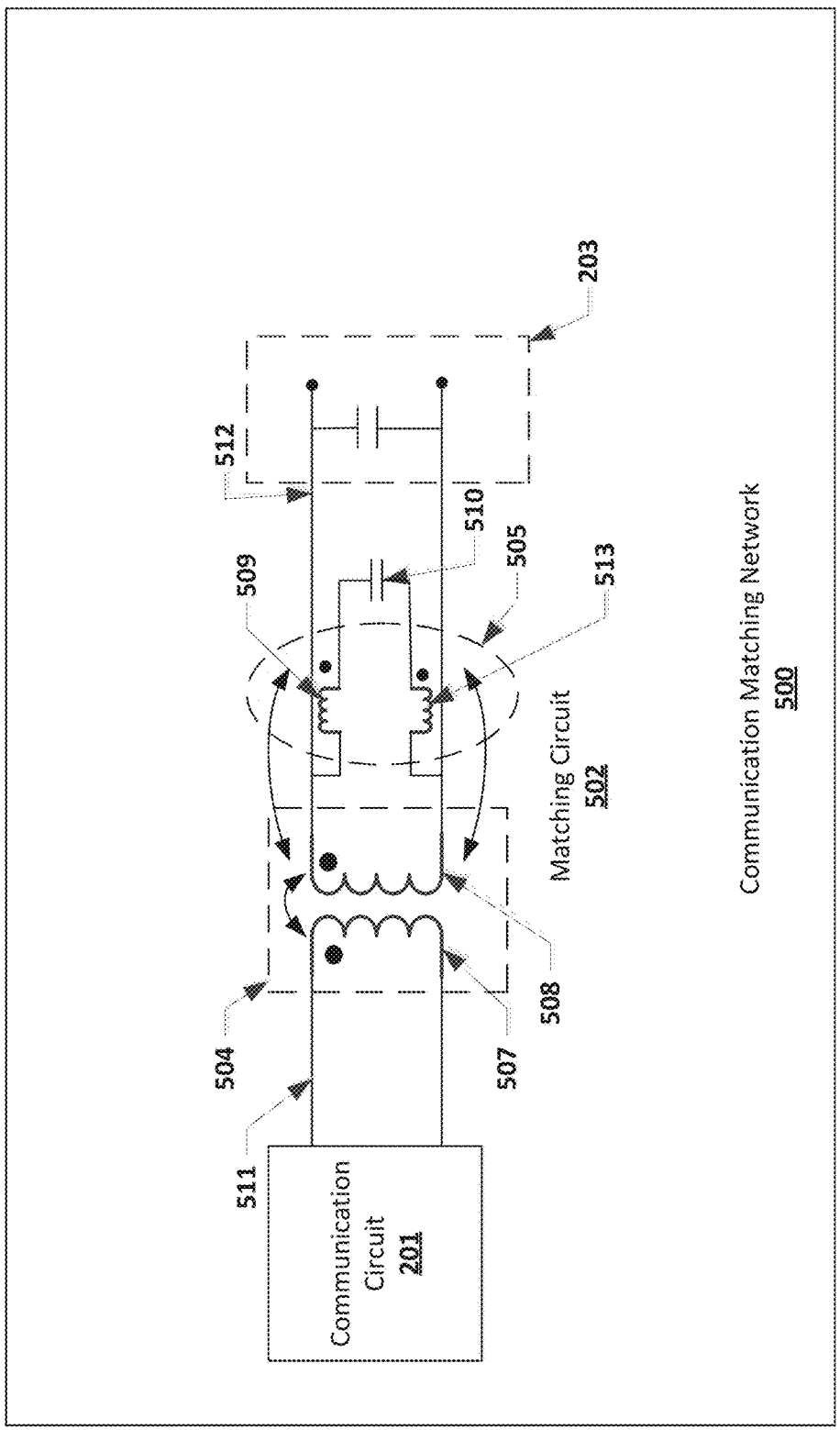

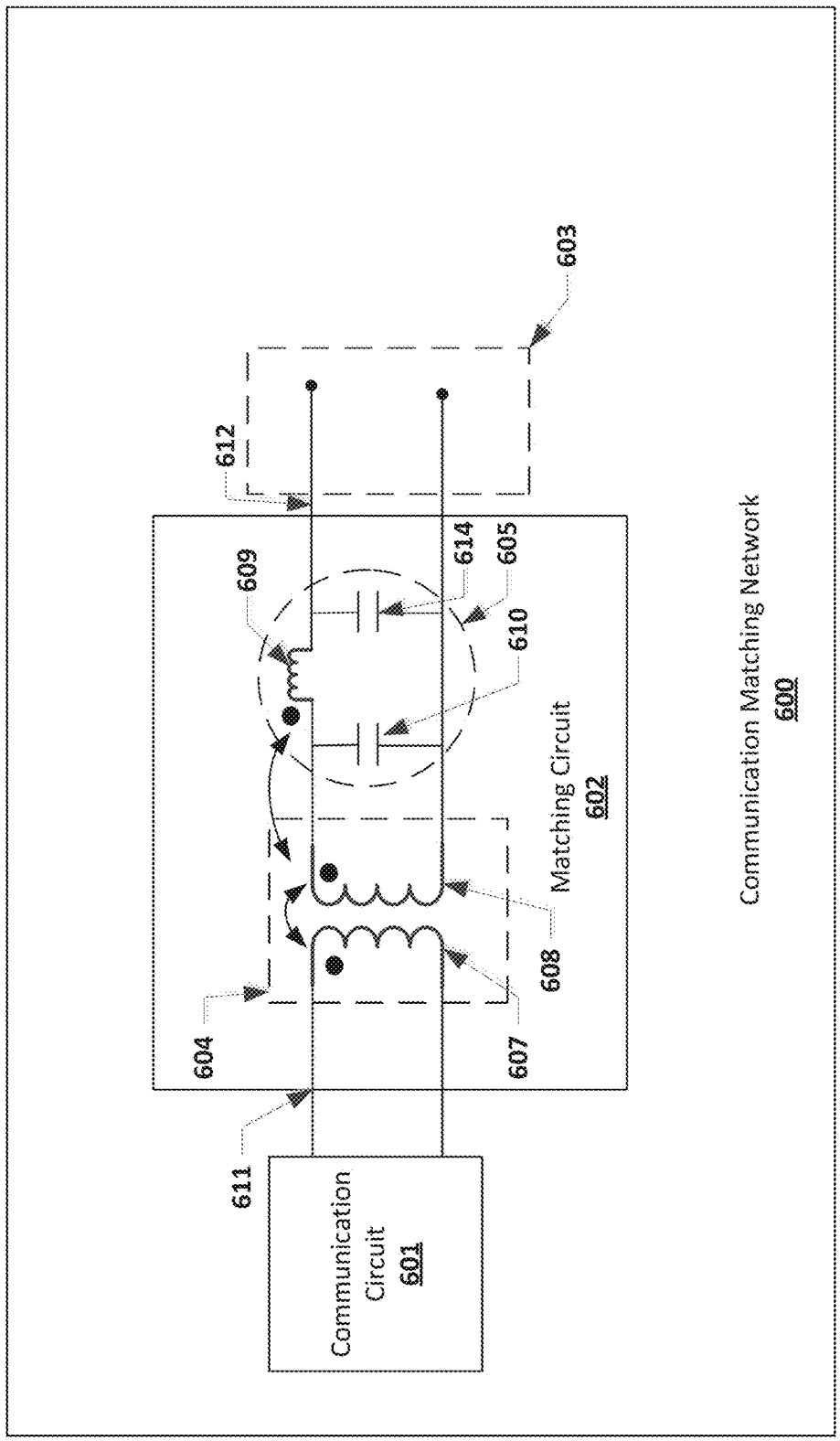

MULTI-HARMONIC MATCHING NETWORKS

FIELD

The present disclosure relates to a matching network and a method to suppress multiple harmonics of a transmit signal that passes through the matching network.

BACKGROUND

In modern communication circuits as the number of bands or standards is increasing, the die size on which the communication circuits reside is reducing and the current consumption of such communication circuits is decreasing while good RF performance is being maintained. Some of the parameters that have become challenging to optimize are the output power, the efficiency, the harmonic suppression and the bandwidth.

However, the required amount of harmonic suppression is obtained at the expense of the output power and current consumption. Further, some multi-harmonic matching networks consume additional space resulting in the increase in the die size.

BRIEF DESCRIPTION OF THE DRAWINGS

FIG. 2A is a block diagram illustrating a communication matching network having an L-network circuit and a harmonic filter according to one aspect of the disclosure.

FIG. 2B is a block diagram illustrating a communication matching network having a transformer circuit and a harmonic trap according to one aspect of the disclosure.

FIG. 5 is a schematic diagram that illustrates a communication matching network comprising a harmonic trap including two inductances of different winding sense that are both physically located inside the first and/or second transformer windings according to one aspect of the disclosure.

FIG. 6 is a schematic diagram that illustrates a communication matching network comprising a matching circuit that includes a harmonic filter having an additional capacitance for enhanced tunability for harmonic suppression and/or impedance matching according to one aspect of the disclosure.

DETAILED DESCRIPTION

Figure 1:
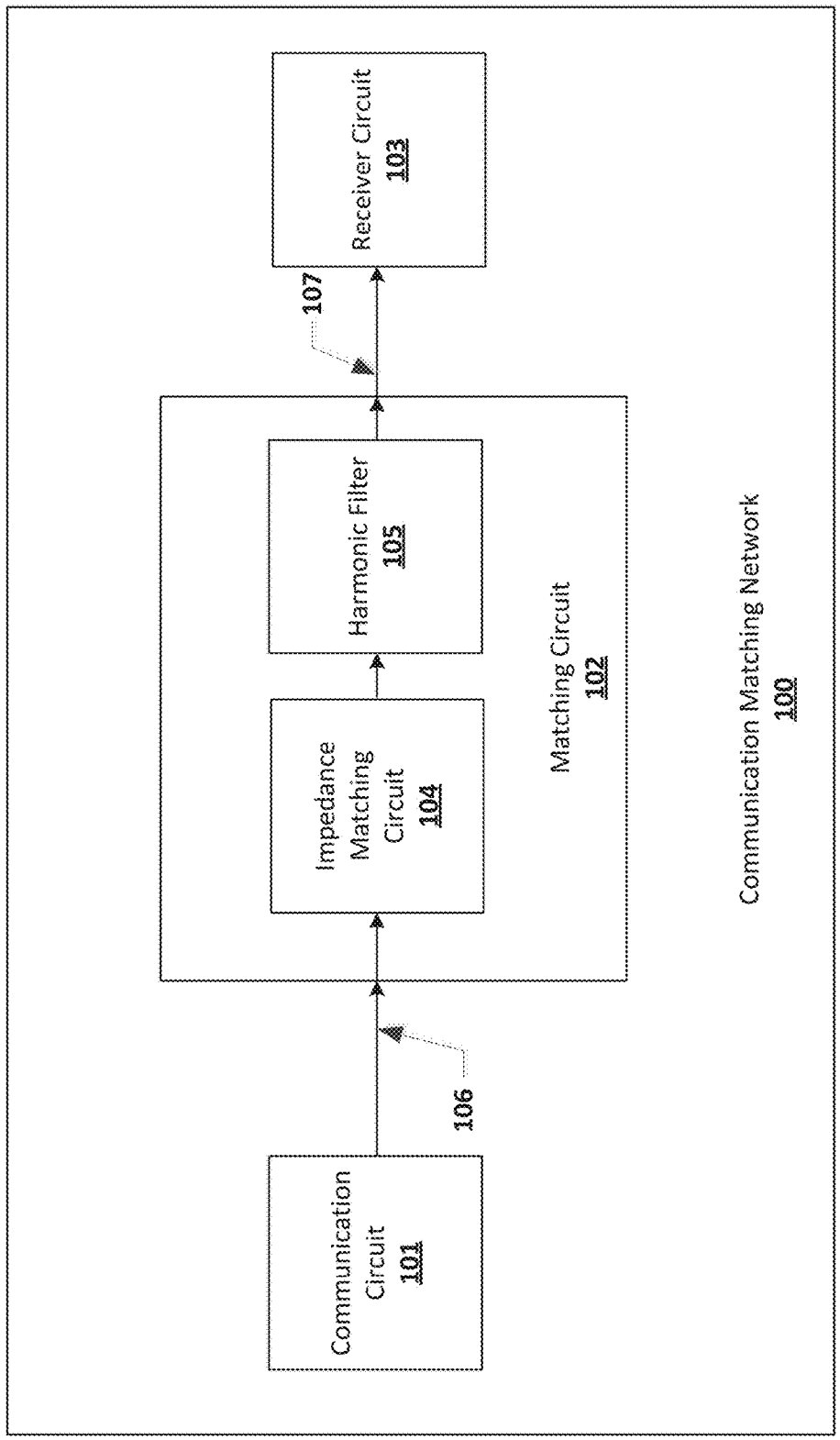
FIG. 1 illustrates a communication matching network having a matching circuit that includes a harmonic filter according to one aspect of the disclosure.

In the present disclosure, a communication matching network is disclosed. The communication matching network suppresses the multiple harmonics in a signal without affecting substantially the die size or the current consumption of the matching network circuitry. The communication matching network comprises a communication circuit configured to provide a signal. The communication matching network further comprises a matching network configured to receive the signal from the communication circuit and suppress one or more harmonics of the received signal to generate a filtered signal. In one aspect the matching network comprises an impedance matching circuit comprising at least a first inductance, wherein the impedance matching circuit is configured to receive the signal from the communication circuit and match an impedance between an output of the communication circuit and an antenna port. The matching network further comprises a harmonic filter comprising a harmonic inductance such that the harmonic inductance is physically within or inside the layout of the first inductance and thus does not increase a size of the matching network circuitry, and is thus also mutually inductively coupled with the first inductance. In one aspect an amount of the mutual inductive coupling is relatively low, for example, 0.2 or less. Further, the communication matching network comprises an antenna port configured to receive the filtered signal from the matching circuit for further processing or transmission. In one aspect the impedance matching circuit comprises an impedance transformer, and in another aspect the impedance matching circuit comprises an L-network in a low pass filter configuration.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the aspects of the present disclosure. However, it will be apparent to one skilled in the art that aspects of the present disclosure may be practiced without these specific details. In other instances, well-known structures and devices are shown in block diagram form rather than in detail in order to avoid obscuring aspects of the present disclosure. In addition, features of the different aspects described hereinafter may be combined with each other, unless specifically noted otherwise.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or aspects of the disclosure herein. Also, one or more of the acts depicted herein may be carried out in one or more separate acts and/or phases.

The modern transmitter concepts are based at least in one aspect on a capacitive Radio Frequency Digital to Analog Converter (RFDAC). Capacitive RFDACs show excessive harmonic generation. These harmonics can be suppressed by multi-stage filtering. However, the additional inductors for such filters increase the die size considerably. Further, high bandwidth is obtained by multi-stage matching networks. However, the multi-stage matching networks comprise additional inductors which further lead to an increase in the die size. Other communication circuits that generate harmonics or require matching face the same issue. Thus, this disclosure is not limited to capacitive RFDACs. Some of the communication circuits may be, for example power amplifiers, mixers, oscillators, low noise amplifiers, or any internal communication structure which provides a signal and requires appropriate impedance matching between an input of the communication circuit and an antenna port. Further, such an output signal typically needs some measure of harmonic suppression.

FIG. 1 illustrates a communication matching network 100. The communication matching network comprises a communication circuit 101, a matching circuit 102 and a receiver circuit 103. The matching circuit 102 further comprises an impedance matching circuit 104 and a harmonic filter 105.

The communication matching network 100 is configured to provide the requisite impedance matching and concurrently suppress the multiple harmonics present in the signal generated by the communication circuit 101. The communication circuit 101 has an output impedance that typically varies or differs from an antenna port at an output of the drive, and also provides a signal 106 which comprises multiple harmonics. The matching circuit 102 is configured to receive the signal 106 from the communication circuit 101 and is configured to provide the requisite impedance matching and suppress the one or more harmonics of the received signal to generate a filtered signal 107. The receiver circuit 103 is configured to receive the filtered signal 107 from the matching circuit 102 for further processing or for transmission in an aspect where the receiver circuit 103 comprises an antenna port that is configured to couple to a transmission antenna.

Turning to FIG. 2A, in one aspect a communication matching network 100A comprises an impedance matching circuit that comprises an L-network circuit 104A. An L-network circuit 104A comprises a first inductance and an L-network capacitance in a number of different configurations and all such configurations are contemplated as falling within the scope of the present disclosure. In one aspect the L-network circuit has the first inductance and L-network capacitance in a low pass filter configuration. While such a configuration will provide some harmonic suppression, in one aspect the values of the first inductance and the L-network capacitance are selected to optimize the matching of the output impedance of the communication circuit 101 to the input impedance of the receiver circuit 103. In one aspect the communication circuit 101 comprises an amplifier which typically exhibits a low output impedance and the receiver circuit 103 comprises an antenna port that couples to an antenna and thus typically has a 500 impedance. Thus in one aspect the first inductance and the L-network capacitance have values that optimize such matching.

FIG. 2B is a schematic diagram illustrating another aspect, wherein the matching circuit 102B comprises a transformer circuit 104B and a harmonic trap 105B. The transformer circuit 104B comprises a first winding and a second winding in one aspect. The first winding of the transformer circuit 104B comprises a first inductance and the second winding of the transformer circuit 104B comprises a second inductance. The harmonic trap 105B comprises a third inductance such that the third inductance is located physically within or inside the first winding and/or the second winding of the transformer circuit 104B, and is thus mutually inductively coupled with the first winding and/or the second winding of the transformer circuit 104B. In one aspect the amount of mutual inductive coupling is relatively low, for example, 0.2 or less.

Figure 3A:
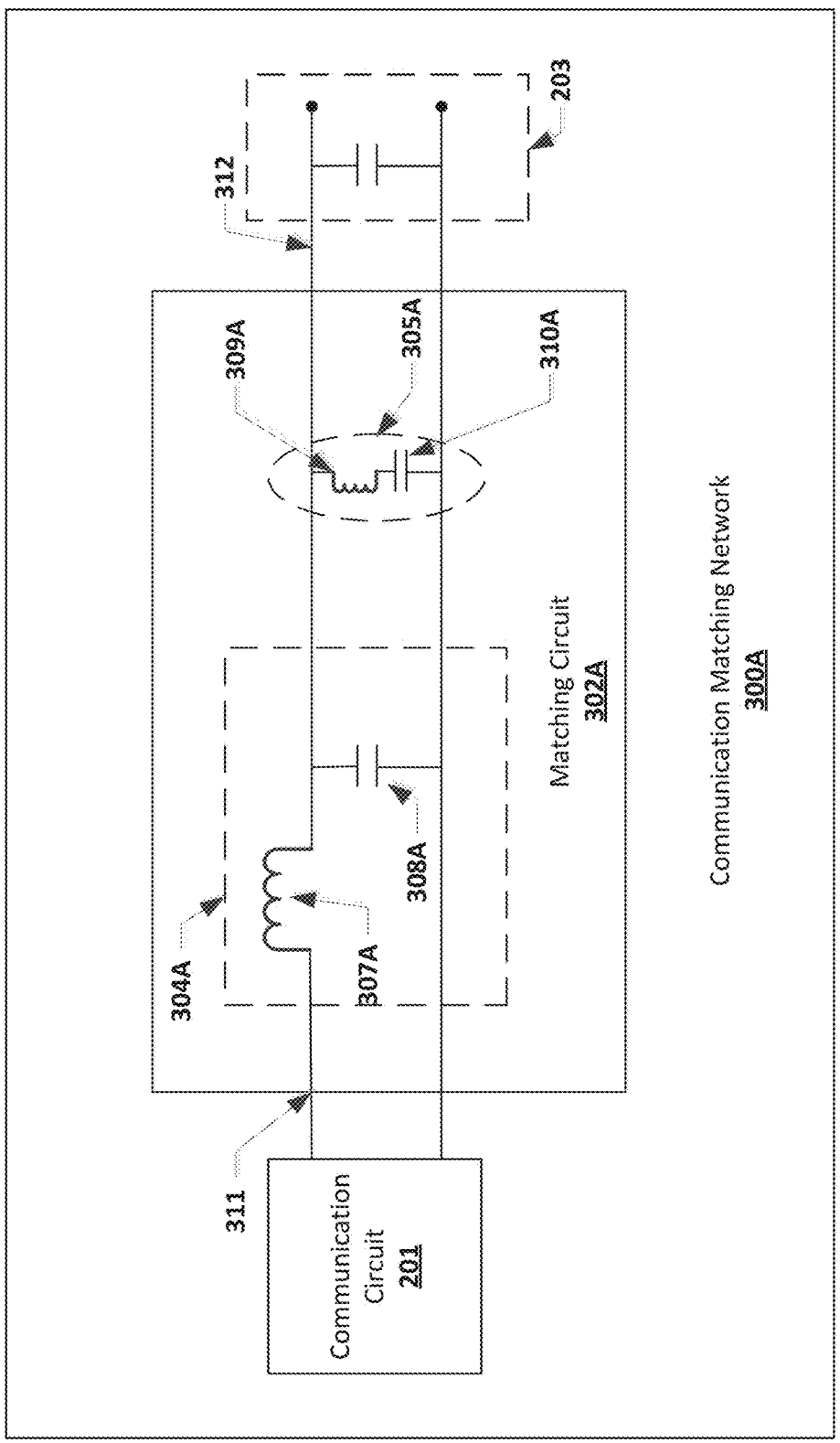
FIG. 3A is a schematic diagram illustrating a communication matching network having one aspect of an L-network circuit and one aspect of a harmonic filter.

FIG. 3A is a schematic diagram of a communication matching network 300A according to one aspect, wherein the impedance matching circuit 104 of FIG. 1 is represented by an L-network 304A and the harmonic filter 105 of FIG. 1 is represented by a harmonic trap 305A. In one aspect the L-network 304A comprises a first inductance 307A and an L-network capacitance 308A, and in FIG. 3A such components are organized or arranged in a low pass filter configuration. While the L-network circuit 304A does provide some low pass filtering functionality, in one aspect the inductance and capacitance values are selected to optimize an impedance matching between an output of the communication circuit 201 and the antenna port 203.

Still referring to FIG. 3A, the harmonic trap 305A comprises a harmonic inductance 309A and a harmonic capacitance 310A arranged in series as shown, wherein the harmonic trap 305A is arranged in parallel with the L-network capacitance 308A of the L-network circuit 304A. While the harmonic trap 305A of FIG. 3A is shown as a single-tuned type filter, other harmonic trap designs such as second and third order damped filters or a C-type damped filter may be employed and all such alternatives are contemplated as falling within the scope of the present disclosure. In each case, the harmonic inductance 309A is located physically within or inside the layout of the first inductance 307A of the L-network circuit 304A, thus obtaining the harmonic suppression without any significant increase in circuit area.

Figure 3B:
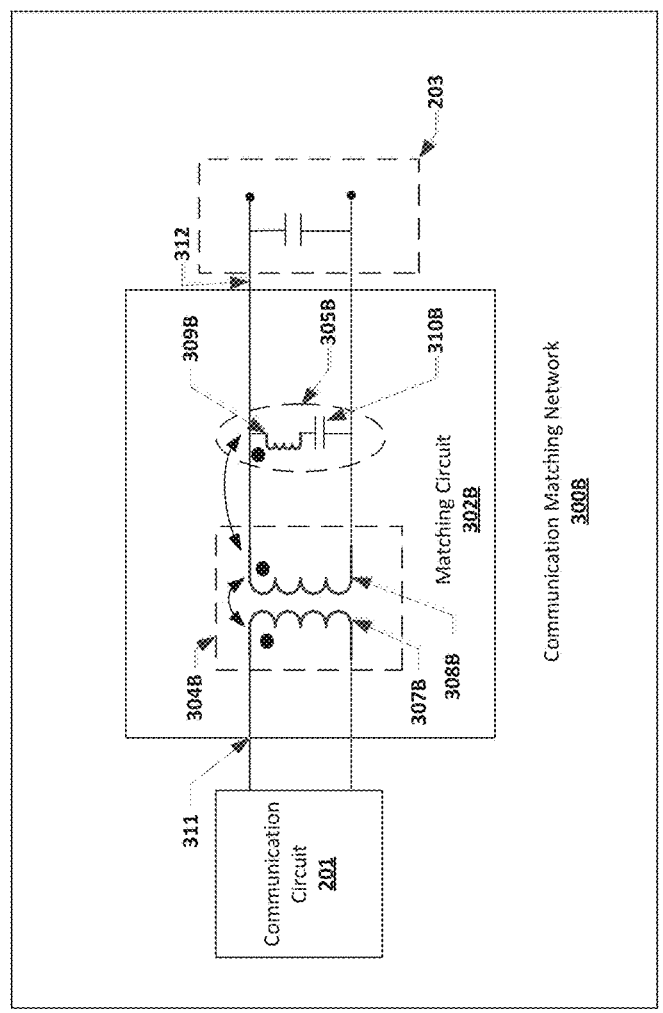
FIG. 3B is a schematic diagram illustrating a communication matching network having one aspect of a transformer and one aspect of a harmonic trap.

FIG. 3B is a schematic diagram illustrating a communication matching network 300B, wherein the impedance matching circuit 104 of FIG. 1 is represented by a transformer 304B. In FIG. 3B the transformer 304B comprises a first winding 307B and a second winding 308B. The first and second windings 307B and 308B comprise first and second inductances such that the first and second windings are inductively coupled to one another. The transformer 304B, in one aspect, provides for the desired impedance matching via the turns ratio N (wherein $N=N_{308B}/N_{307B}$). The relationship between the impedance and the winding turns may be given by, for example, $Z_{203}/Z_{201}=(N_{308B}/N_{307B})^2$. Thus by adjusting the turns ratio of the transformer, the requisite impedance matching can be achieved.

The harmonic trap 305B operates in a manner similar to that discussed above in harmonic trap 305A of FIG. 3A.

As highlighted above, the first inductance of the harmonic filter 105 is placed inside the windings of the coil of the impedance matching circuit 104.

Figure 4A:
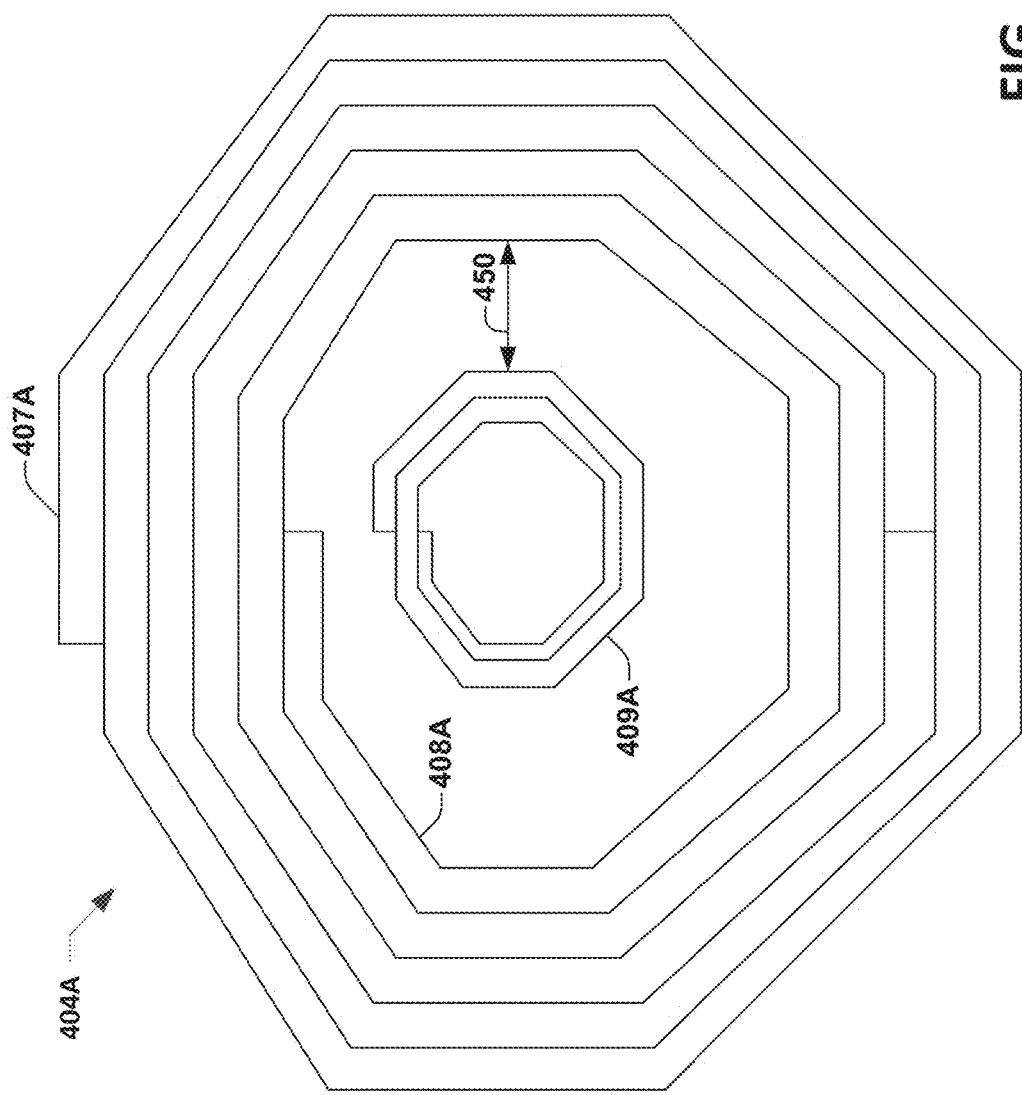
FIG. 4A is a plan view that illustrates a layout representation of first and second windings of a transformer and a third inductance of a harmonic filter wound as a coil located physically inside the first and second transformer windings according to one aspect of the disclosure.

FIG. 4A illustrates a layout representation of a transformer circuit 404A such as the transformer 304B of FIG. 3B and a harmonic inductance of a harmonic filter 105 which can be part of an LC type harmonic filter or a harmonic trap in a communication matching network according to one aspect of the disclosure. The transformer 404A comprises a first winding 407A and a second winding 408A. The first winding 407A comprises a first inductance and the second winding 408A comprises a second inductance. A third inductance 409A (e.g., the harmonic inductance) is placed inside the first winding 407A and the second winding 408A of the transformer 404A. The third inductance 409A does not occupy extra area in the circuit arrangement, thus suppressing the harmonics without increase the size of the overall structure (without increasing the die size).

As highlighted above, in one aspect an amount of inductive coupling between the third inductance 409A and the first and/or second inductances 407A, 408A is desired to be relatively low. In one aspect such inductive coupling is 0.2 or less, however, in other aspects it may be greater. One way to achieve an inductive coupling that is sufficiently low is to increase a distance 450 between the windings of the third inductance 409A and the windings of the first and second inductances, respectively. Thus in one aspect, the distance 450 is established to generate an inductive coupling that is below a desired threshold.

Figure 4B:
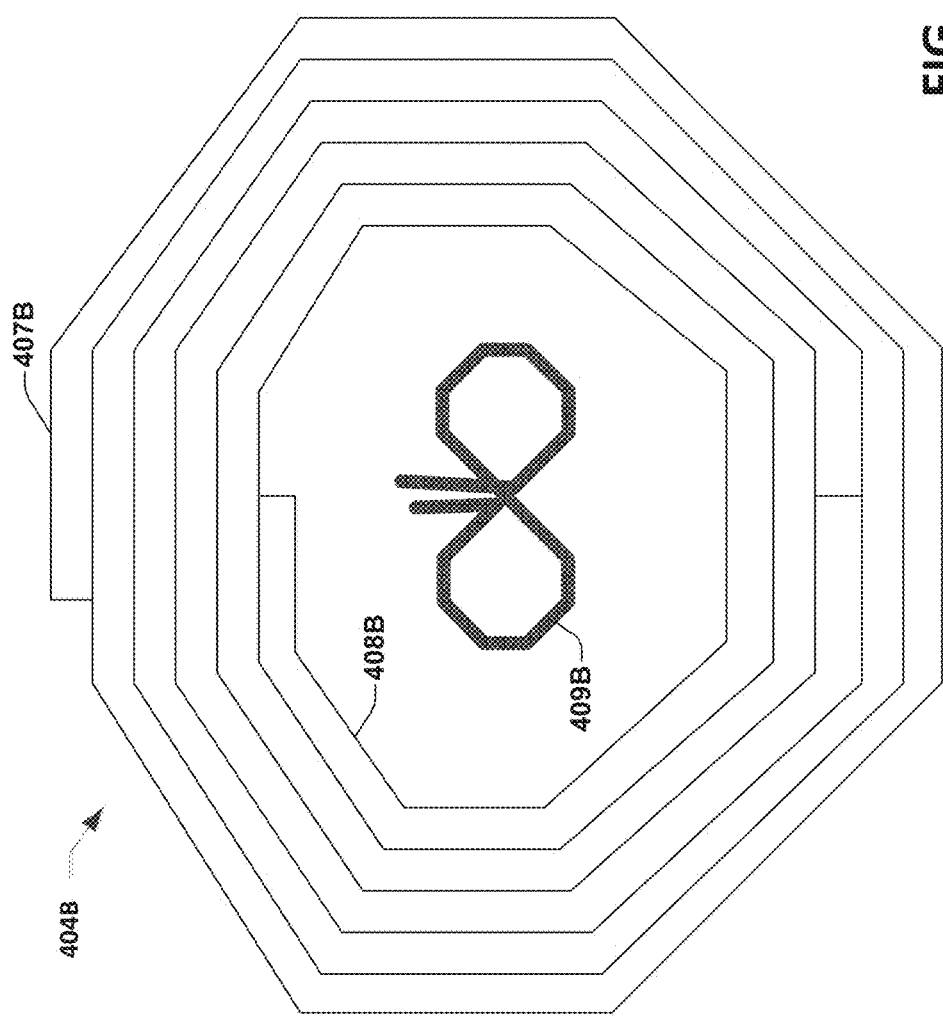
FIG. 4B is a plan view that illustrates a layout of first and second windings of a transformer and a third inductance of a harmonic filter wound as an 8-shape according to one aspect of the disclosure.

FIG. 4B is a plan view illustrating another layout aspect wherein the third inductance 409B is inside or within the layout of the first and/or second inductances 407B, 408B of the transformer 404B. As shown in FIG. 4B, in one aspect the third inductance 409B may be an 8-shape structure that is physically within or inside the first and second windings 407B, 408B of the transformer 404B. Thus the third inductance layout structure 409B may comprise various different shaped structures and all such alternatives are contemplated as falling within the scope of the present disclosure.

The harmonic trap 105B is configured to filter one or more frequencies of the received signal. The capacitance and the third inductance together form an LC filter.

The resonance of the LC filter of the harmonic trap 105B is determined by several quantities as appreciated below. Depending on the frequency of the harmonics to be filtered out, the resonance of the LC filter will vary and depends on the inductance value of the third inductance 309A and the value of the capacitance 310A present in the LC filter. In some aspects, the third inductance comprises one or more inductances 509, 513 which are mutually inductively coupled with each other, as illustrated in FIG. 5. In such cases, the resonance of the LC filter also depends on the mutual inductive coupling between the one or more inductances. In one aspect the winding sense of the inductances 509, 513 differ from one another, as illustrated in FIG. 5.

The capacitance 310A of the harmonic trap 305A in some aspects is a variable capacitor. The variable capacitor can be continuously variable capacitor or a digitally variable capacitor.

FIG. 5 is therefore another example of a communication matching network according to another aspect of the disclosure. The aspect according to FIG. 5 is similar to the example illustrated in FIGS. 2B and 3A. The harmonic trap 505 of FIG. 5, however, has two inductances 509 and 513 and a capacitance 510. The advantage of the aspect according to FIG. 5 over the aspect according to FIG. 3A is that the harmonic trap 505 helps in a better design flexibility when compared to the harmonic trap 305A of FIG. 3A. The two inductances 509 and 513 are coupled between themselves and are physically located within both the first winding 507 and the second winding 508 of the transformer 504. In one aspect the mutual inductive coupling between the transformer windings and the inductances 509 and 513 is 0.2 or less.

In one aspect, in order to improve the bandwidth of the communication system, multi-stage matching networks are used. FIG. 6 illustrates an aspect of a multi-stage matching network. The communication matching network of FIG. 6 is configured to suppress the multiple harmonics of the signal and improve the bandwidth of the system.

The communication matching network 600 comprises a communication circuit 601, a matching circuit 602 and a receiver circuit 603. The matching circuit 602 further comprises a transformer 604 and a harmonic trap 605.

The communication matching network 600 is configured to suppress the multiple harmonics present in the signal. The communication circuit 601 provides a signal 611 which comprises multiple harmonics. The matching circuit 602 is configured to receive the signal 611 from the communication circuit 601 and is configured to suppress the one or more harmonics of the received signal to generate a filtered signal 612. The receiver circuit 603 (e.g., an antenna port) is configured to receive the filtered signal 612 from the matching circuit 602 for further processing.

The matching circuit 602 comprises a transformer 604 and a harmonic trap 605. The transformer 604 comprises a first winding 607 and a second winding 608. The first winding 607 of the transformer 604 comprises a first inductance and the second winding 608 of the transformer 604 comprises a second inductance. The harmonic trap 605 comprises a third inductance 609 such that the third inductance 609 is located within or inside the windings of the first and/or second windings of the transformer and thus the third inductance 609 is mutually inductively coupled with both the first winding 607 and the second winding 608 of the transformer 604. In one aspect the amount of mutual inductive coupling is 0.2 or less. The harmonic trap 605 further comprises two capacitors 610 and 614. In one aspect the third inductance 609 is not used for harmonic filtering, but it is used for wideband network matching. The communication matching network 600 is a combination of a two-stage transformer 604 and L-type matching network which comprises the third inductance 609 and the capacitor 614. The L-type matching network, in some aspects, is extended to have multiple stages to have a high bandwidth matching circuit. In case of multi-stage matching networks, each of the matching networks can be independently tuned to suppress the desired frequencies.

Figure 7A:
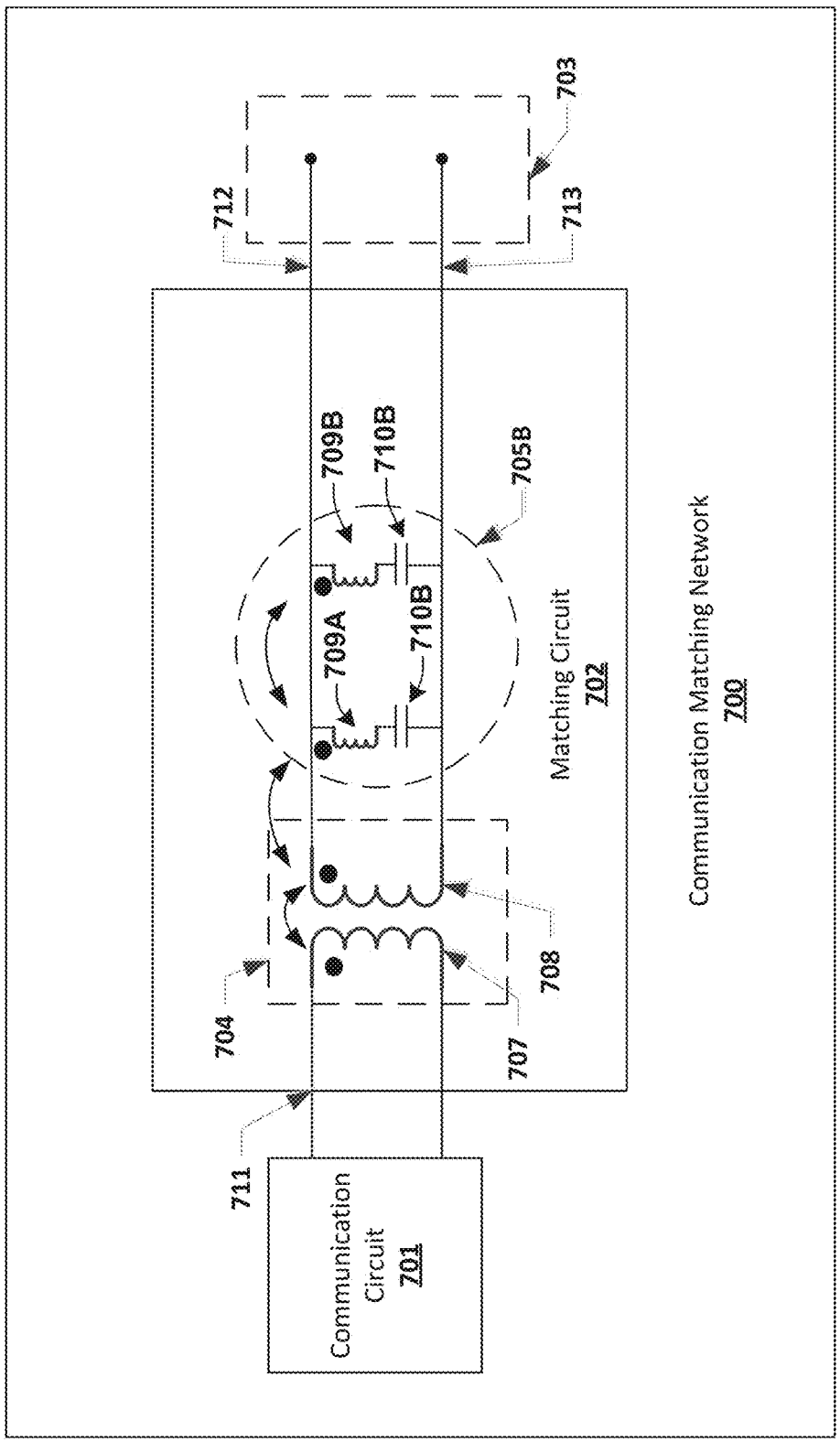
FIG. 7A is a schematic diagram that illustrates a communication matching network comprising a transformer and first and second harmonic traps in parallel with one another according to one aspect of the disclosure.

FIG. 7A illustrates yet another communication matching network 700 according to one aspect of the disclosure. In FIG. 7A a transformer 704 is shown as the impedance matching circuit and multiple (e.g., two) harmonic traps 705A and 705B are shown as the harmonic filter. FIG. 7A shows that if a more wide-band harmonic suppression is needed or desired, two or more harmonic traps 705A and 705B may be employed that are each independently tuned. That is, the harmonic inductance and the harmonic capacitance values 709A, 709B and 710A, 710B, respectively, may be selected to define the multiple stop gaps of each respective harmonic trap.

Figure 7B:
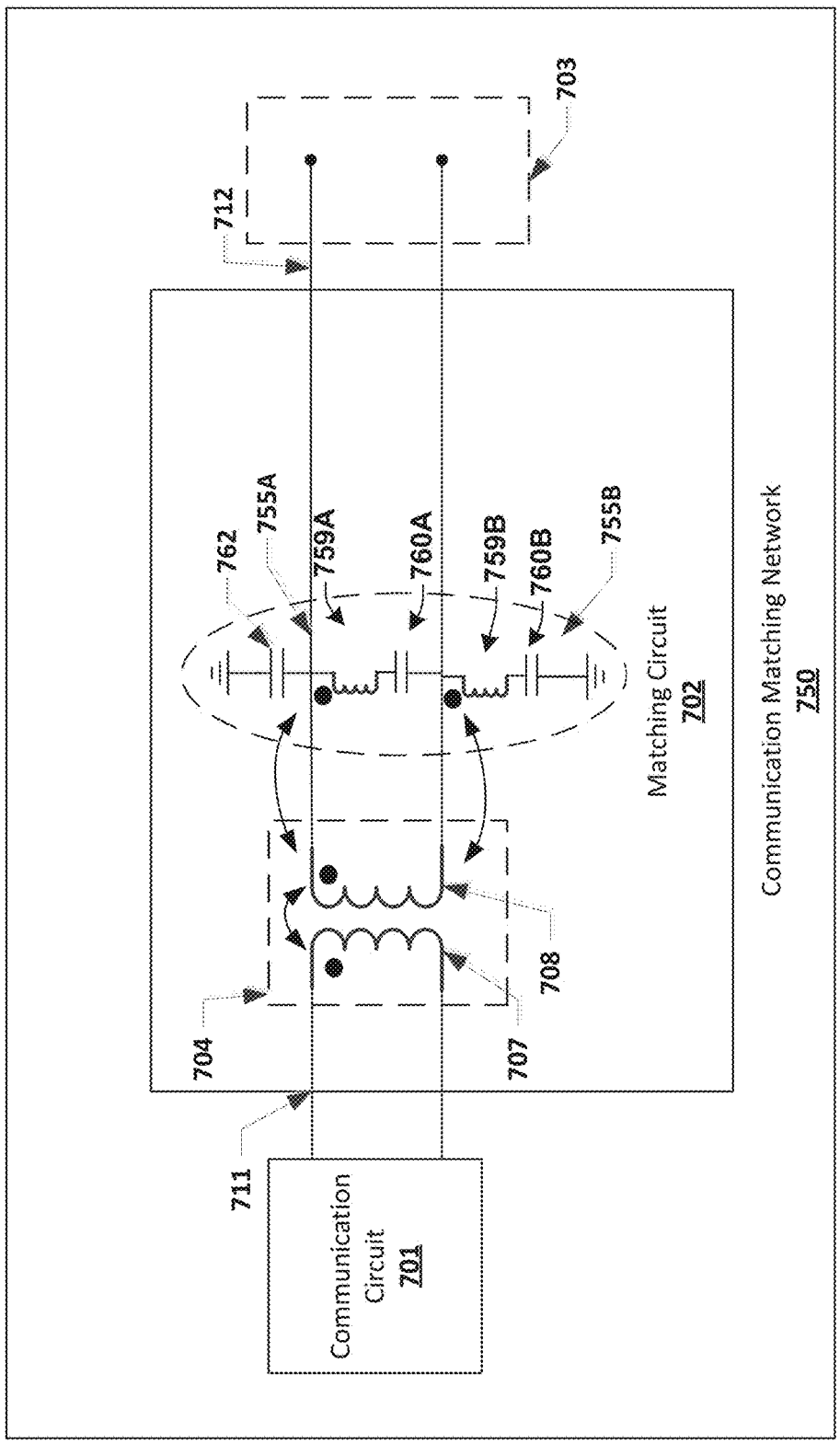
FIG. 7B is a schematic diagram that illustrates a communication matching network comprising a transformer and first and second harmonic traps used asymmetrically at the second side of the transformer according to one aspect of the disclosure.

FIG. 7B illustrates still another communication matching network 750 according to one aspect of the disclosure. In FIG. 7B the transformer 704 is arranged in a manner similar to that in FIG. 7A. In FIG. 7B two harmonic traps are provided 755A and 755B, respectively. The harmonic traps 755A and 755B are configured in an asymmetric fashion as illustrated. It should be noted that the circuit of FIG. 7B has two outputs 712 and 713. In one instance, if 712 is connected to RF ground (e.g., through an internal or external switch), the harmonic suppression at the output 713 is determined by the two harmonic traps 755A and 755B. Alternatively, if 713 is grounded, the harmonic suppression at the output 712 is determined by the harmonic trap 755A and the capacitance 762. Therefore in the aspect of FIG. 7B the transfer function from 711 to 712 is different than the transfer function from 711 to 713. In the above fashion there is an asymmetry that allows for selective tuning for different filtering characteristics.

Figure 8:
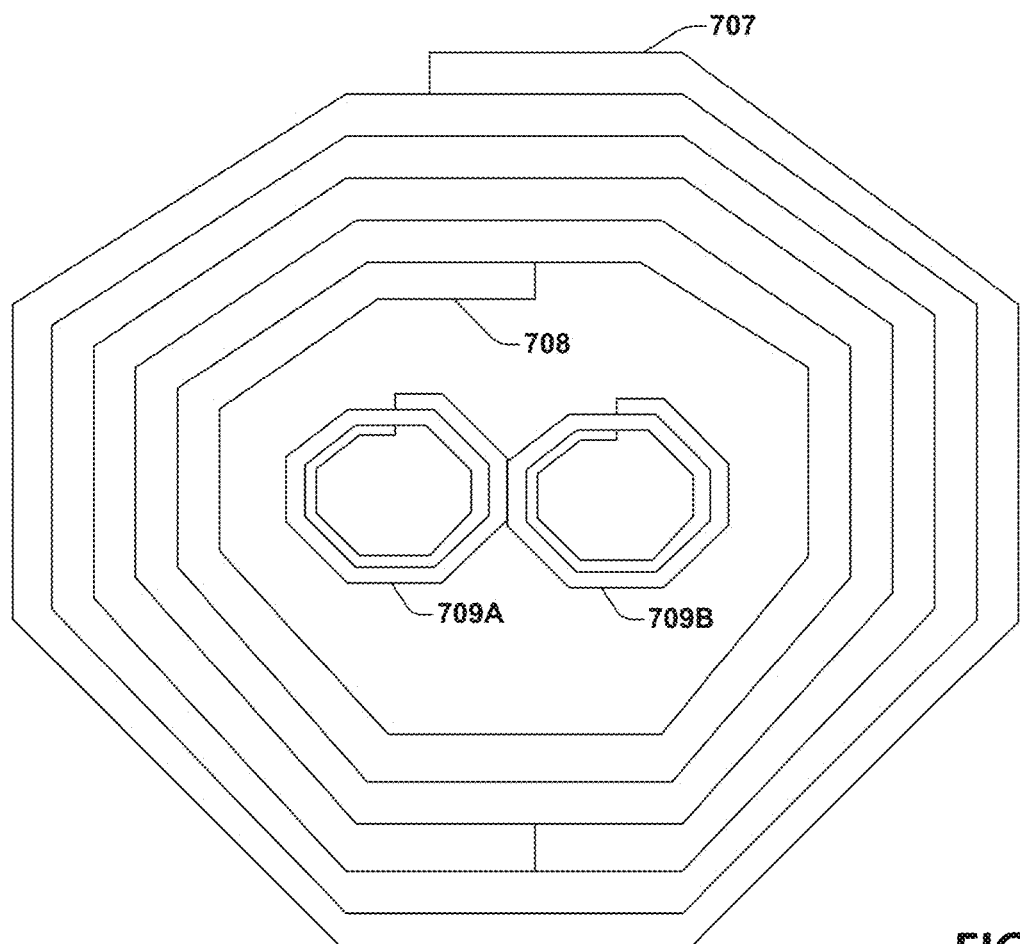
FIG. 8 is a plan view illustrating a layout of first and second windings of a transformer and third and fourth inductances of the first and second harmonic traps, respectively, that are both located physically inside the first and/or second transformer windings according to one aspect of the disclosure.

FIG. 8 is a plan view illustrating an example layout of the harmonic inductances of the harmonic traps 705A and 705B of FIG. 7 according to one aspect. In FIG. 8, both harmonic inductances 709A, 709B are physically within or inside the windings 707, 708 of the transformer 704. In the above way the inductances of the harmonic traps provide the desired harmonic suppression, yet do not require additional space in the circuit.

Figure 9:
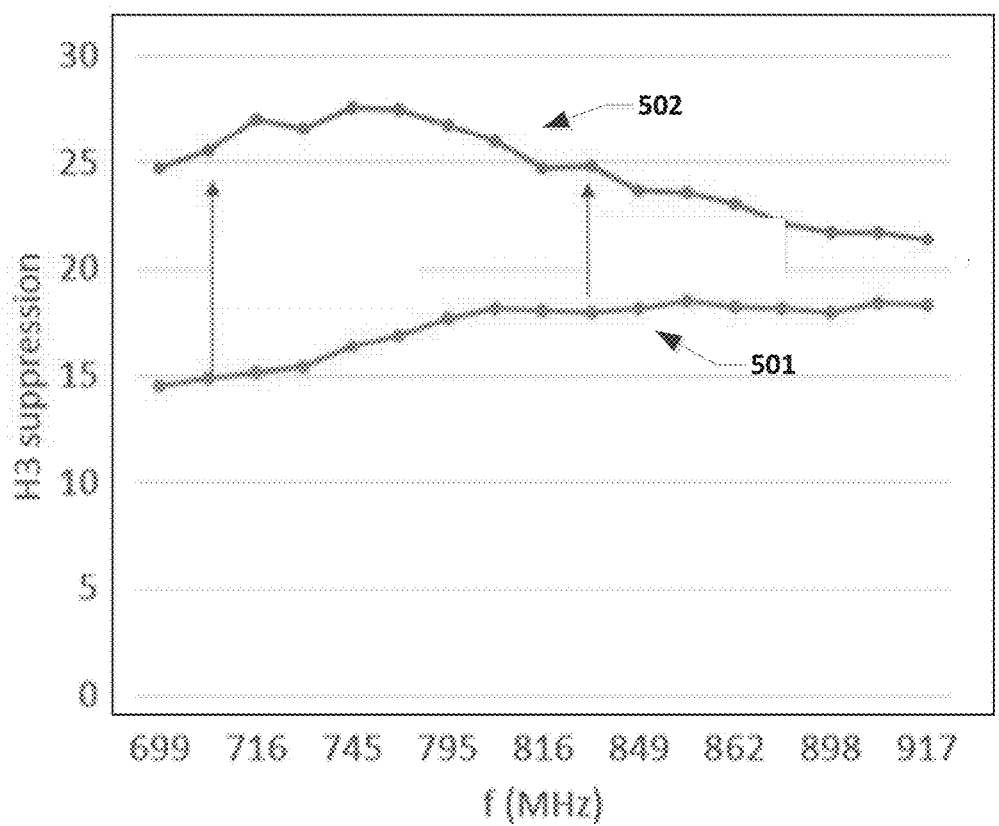
FIG. 9 is a graph that illustrates an increase in harmonic suppression using a communication matching network according to one aspect of the disclosure.

FIG. 9 illustrates the improvement in harmonic suppression with the harmonic trap circuit. The trace 901 denotes the harmonic suppression by a communication circuit without the harmonic trap circuit. The trace 902 denotes the harmonic suppression by a communication circuit after the introduction of the harmonic trap circuit. As appreciated above, the harmonic suppression of the communication matching network has significantly improved without an increase of the die size.

Figure 10:
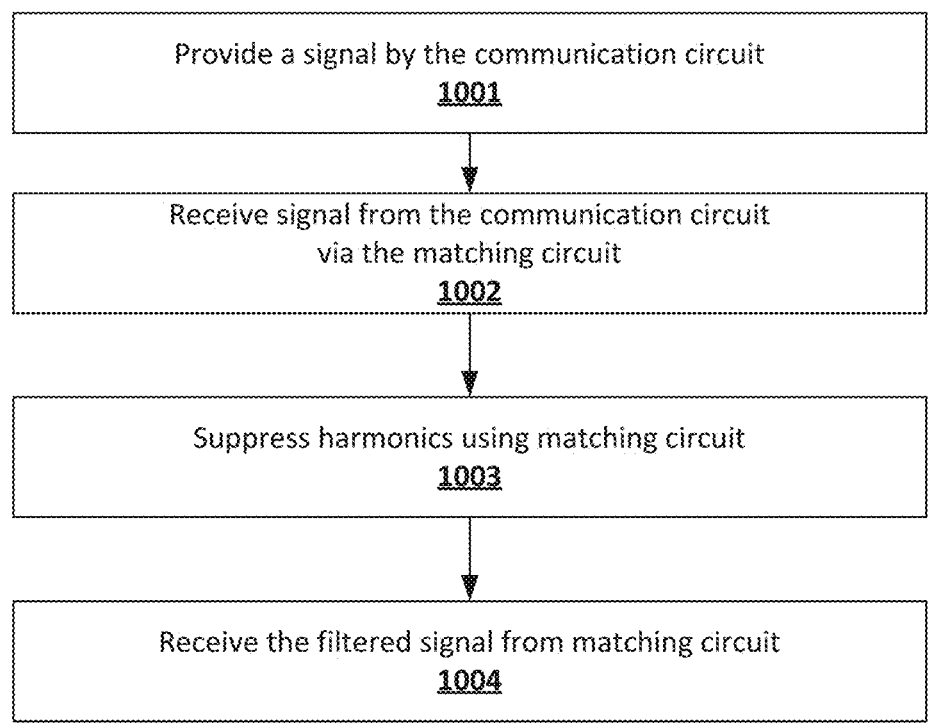
FIG. 10 is a flow chart diagram that illustrates a method for multi-harmonic suppression according to one aspect of the disclosure.

FIG. 10 illustrates a method to suppress multiple harmonics in a communication system. Act 1001 denotes providing, by a communication circuit, a signal. Act 1002 denotes receiving, by a matching network, the signal from the communication circuit. Act 1003 denotes, suppressing, by the matching network, one more harmonics of the received signal to generate a filtered signal. The matching circuit comprises an impedance matching circuit such as shown in FIG. 1, and in one aspect such circuit may comprise an L-network or a transformer comprising a first winding and a second winding. The first winding comprises a first inductance and the second winding comprises a second inductance. The matching network further comprises a harmonic filter such as a harmonic trap comprising a third inductance such that the third inductance is located within or inside the first and/or second windings of the transformer and therefore the third inductance is mutually inductively coupled with the first winding and/or the second winding. In one aspect the amount of mutual inductive coupling is 0.2 or less. Act 10004 denotes receiving, by a receiver circuit, the filtered signal from the matching network for further processing or transmission.

In an Example 1 a communication matching network comprises a communication circuit configured to provide a signal, an antenna port configured to receive a conditioned signal associated with the signal from the communication circuit, and a matching network coupled between the communication circuit and the antenna port, and configured to provide an impedance matching therebetween. The matching network comprises an impedance matching circuit comprising at least a first inductance, the impedance matching circuit configured to receive the signal from the communication circuit and match an impedance between an output of the communication circuit and the antenna port, and a harmonic filter configured to receive the signal from the impedance matching circuit and provide a harmonic filtering thereof to remove undesired harmonics in the signal, thereby generating the conditioned signal. The harmonic filter comprises a harmonic inductance that is physically located inside a layout of the first inductance.

In an Example 2, in the Example 1 the impedance matching circuit comprises an L-network comprising the first inductance and an L-network capacitance coupled together in a low pass filter configuration.

In an Example 3, in either of the Examples 1 or 2 the harmonic filter comprises the harmonic inductance and a harmonic capacitance coupled together in a low pass filter configuration, wherein values of the first inductance and the L-network capacitance are selected based on an impedance matching requirement between the output of the communication circuit and the antenna port, and the values of the harmonic inductance and the harmonic capacitance are selected based on a cut-off frequency requirement of the harmonic filter to ensure removal of the undesired harmonics in the signal.

In an Example 4, in any of the Examples 1-3 the impedance matching circuit comprises a transformer comprising the first inductance as a first winding and a second inductance as a second winding, and wherein the first winding and the second winding are inductively coupled together.

In an Example 5, in either Example 1 or 4 the harmonic filter comprises a harmonic trap comprising the harmonic inductance as a third inductance, and wherein the third inductance is physically located inside a layout of the first inductance or the second inductance, or both.

In an Example 6, in the Example 5 the harmonic trap comprises a harmonic capacitance and a second harmonic inductance as s fourth inductance, wherein the harmonic capacitance and the fourth inductance are connected in series with the third inductance, and wherein the harmonic trap is coupled in parallel with the second winding of the transformer.

In an Example 7, in the Example 5 the harmonic filter comprises a second harmonic trap connected in parallel with the harmonic trap, and the second harmonic trap comprises a second harmonic capacitance connected in series with a second harmonic inductance as a fourth inductance, wherein the third inductance and the fourth inductance are physically located inside the layout of the first inductance.

In an Example 8, in the Example 5 the harmonic filter comprises a second harmonic trap arranged asymmetrically with respect to the harmonic trap such that upon a different selection of one of two outputs connected to ground a different transfer function is obtained, thereby permitting selectively differing filtering characteristics.

In an Example 9, in the Example 4 the harmonic filter comprises an L-type matching network to facilitate a wide-band network matching, wherein the L-type matching network comprises a first capacitance in parallel with the second winding of the transformer and a series combination of the third inductance and a second capacitance coupled together in parallel with the first capacitance.

In an Example 10, in any of the Examples 1-9 the harmonic inductance of the harmonic filter is shaped as a coil or as an 8-shape winding inside the layout of the first inductance.

In an Example 11 a communication matching network for multi-harmonic suppression is disclosed and comprises a communication circuit configured to provide a signal, and a matching circuit configured to receive the signal from the communication circuit and suppress one or more harmonics of the received signal to generate a filtered signal. In the communication matching network the matching circuit further comprises a transformer comprising a first winding and a second winding, wherein the first winding comprises a first inductance and the second winding comprises a second inductance. Further the matching network comprises a harmonic trap comprising a third inductance such that the third inductance is physically located inside a layout of the first winding or the second winding, or both. Lastly, the communication matching network comprises an antenna port configured to receive the filtered signal from the matching circuit for further processing or transmission.

In an Example 12, in the Example 11, the communication matching network further comprises another inductance that is mutually inductively coupled with the third inductance, wherein the third inductance and the another inductance are both physically located inside the layout of the first winding or the second winding, or both.

In an Example 13, in the Examples 11 or 12, the harmonic trap further comprises a capacitance, and wherein the capacitance and the third inductance form an LC filter.

In an Example 14, in the Example 13 the capacitance is a variable capacitor, thereby making the harmonic trap tunable.

In an Example 15, in the Example 14 the variable capacitor is a continuously variable capacitor or a digitally variable capacitor.

In an Example 16, in any of the Examples 11-15 the transformer is an impedance matching transformer.

In an Example 17, in any of the Examples 11-16 the harmonic trap is placed inside the first winding and the second winding of the transformer.

In an Example 18, in any of the Examples 11-17 the communication circuit comprises an amplifier, or a mixer, or an oscillator.

In an Example 19, in either Example 11 or 12 the harmonic trap is tuned to suppress a desired frequency, wherein the harmonic trap is tuned by varying the third inductance, or varying the capacitance, or varying both the inductance and the capacitance.

In an Example 20 a method to suppress multiple harmonics in a signal in a communication system is disclosed. The method comprises providing, by a communication circuit, the signal, and receiving, by a matching circuit, the signal. The method further comprises suppressing, by the matching circuit, one or more harmonics of the received signal to generate a filtered signal. The matching circuit comprises an impedance matching circuit comprising a first inductance, and the impedance matching circuit is configured to receive the signal from the communication circuit and match an impedance between an output of the communication circuit and an antenna port. The impedance matching circuit further comprises a harmonic filter configured to receive the signal from the impedance matching circuit and provide a harmonic filtering thereof to suppress harmonics in the signal, thereby generating the filtered signal, wherein the harmonic filter comprises a harmonic inductance that is physically located inside a layout of the first inductance. Lastly, the method comprises receiving, by the antenna port, the filtered signal from the matching circuit for further processing or transmission.

In an Example 21, in the Example 20 the impedance matching circuit comprises an L-network comprising the first inductance and an L-network capacitance coupled together in a low pass filter configuration.

In an Example 22, in the Example 21 the harmonic filter comprises the harmonic inductance and a harmonic capacitance coupled together in a low pass filter configuration, wherein values of the first inductance and the L-network capacitance are selected based on an impedance matching requirement between the output of the communication circuit and the antenna port, and the values of the harmonic inductance and the harmonic capacitance are selected based on a cut-off frequency requirement to ensure removal of the undesired harmonics in the signal.

In an Example 23, in any of the Examples 20-22 the impedance matching circuit comprises a transformer comprising the first inductance as a first winding and a second inductance as a second winding, and wherein the first winding and the second winding are inductively coupled together.

In an Example 24, in the Example 23 the harmonic filter comprises a harmonic trap comprising the harmonic inductance as a third inductance, and wherein the third inductance is physically located inside a layout of the first inductance or the second inductance, or both.

In an Example 25, in any of the Examples 20-24 the harmonic inductance of the harmonic filter is shaped as a coil or as an 8-shape winding inside the layout of the first inductance.

Although the disclosure has been illustrated and described with respect to one or more implementations, alterations and/or modifications may be made to the illustrated examples without departing from the spirit and scope of the appended claims.

Moreover, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:
1. A communication matching network, comprising:
a communication circuit configured to provide a signal;
a matching network coupled between the communication circuit and an antenna port, and configured to provide an impedance matching between the communication circuit and the antenna port comprising:

an impedance matching circuit comprising at least a first inductance and a second inductance, the impedance matching circuit configured to receive the signal from the communication circuit and match an impedance between an output of the communication circuit and the antenna port; and a harmonic filter configured to receive the signal from the impedance matching circuit and perform a harmonic filtering of the signal to remove undesired harmonics in the signal to generate a conditioned signal, wherein the harmonic filter comprises a harmonic inductance as a third inductance that is physically located inside a layout of the first inductance, and is further configured to establish an inductive coupling between the first inductance and the harmonic inductance that is below a predetermined threshold based on a minimum distance between windings of the harmonic inductance and windings of at least one of the first or the second inductances being greater than a minimum distance between the windings of the first inductance and the second inductance; wherein the harmonic inductance of the harmonic filter is shaped as a substantially 8-shaped winding inside the layout of the first inductance; and and the antenna port configured to receive the conditioned signal associated with the signal from the communication circuit.

2. The communication matching network of claim 1, wherein the impedance matching circuit comprises a transformer comprising the first inductance as a first winding and the second inductance as a second winding, and wherein the first winding and the second winding are inductively coupled together.

3. The communication matching network of claim 2, wherein the harmonic filter comprises a harmonic trap having the harmonic inductance as the third inductance, and wherein the third inductance is physically located inside a layout of the first inductance or the second inductance, or a combination of first and second inductance.

4. The communication matching network of claim 3, wherein the harmonic trap comprises a harmonic capacitance and a second harmonic inductance as s fourth inductance, wherein the harmonic capacitance and the fourth inductance are connected in series with the third inductance, and wherein the harmonic trap is coupled in parallel with the second winding of the transformer.

5. The communication matching network of claim 3, wherein the harmonic filter comprises a second harmonic trap connected in parallel with the harmonic trap, the second harmonic trap comprising a second harmonic capacitance connected in series with a second harmonic inductance as a fourth inductance, wherein the third inductance and the fourth inductance are physically located inside the layout of the first inductance.

6. The communication matching network of claim 3, wherein the harmonic filter comprises a second harmonic trap arranged asymmetrically with respect to the harmonic trap to obtain a different transfer function upon a different selection of one of two outputs connected to ground.

7. The communication matching network of claim 2, wherein the harmonic filter comprises an L-type matching network to facilitate a wideband network matching, wherein the L-type matching network comprises a first capacitance in parallel with the second winding of the transformer and a series combination of the third inductance and a second capacitance coupled in parallel with the first capacitance.

8. A communication matching network for multi-harmonic suppression, the communication matching network comprising:

a communication circuit configured to provide a signal;

a matching circuit configured to receive the signal from the communication circuit and suppress one or more harmonics of the received signal to generate a filtered signal, wherein the matching circuit comprises a transformer comprising a first winding and a second winding, wherein the first winding comprises a first inductance and the second winding comprises a second inductance, wherein the matching network comprises a harmonic trap comprising a third inductance to arrange the third inductance being physically located inside a layout of the first winding or the second winding, or both the first winding and the second winding, and configured to establish an inductive coupling between the third inductance and both the first inductance and the second inductance that is below a predetermined threshold, wherein a minimum distance between windings of the third inductance and windings of at least one of the first winding or the second winding is larger than a minimum distance between the windings of the first winding and the second winding; wherein the third inductance of the harmonic trap is shaped as a substantially 8-shaped winding inside the layout of the first inductance; and and an antenna port configured to receive the filtered signal from the matching circuit for further processing or transmission.

9. The communication matching network of claim 8, wherein the harmonic trap further comprises a capacitance, and wherein the capacitance and the third inductance form an LC filter.

10. The communication matching network of claim 9, wherein the capacitance is a variable capacitor to tune the harmonic trap.

11. The communication matching network of claim 10, wherein the variable capacitor is a continuously variable capacitor or a digitally variable capacitor.

12. The communication matching network of claim 8, further comprising a fourth inductance that is mutually inductively coupled with the third inductance, wherein the third inductance and the fourth inductance are both physically located inside the layout of the first winding or the second winding, or both.

13. The communication matching network of claim 8, wherein the transformer is an impedance matching transformer.

14. The communication matching network of claim 8, wherein the harmonic trap is disposed inside the first winding and the second winding of the transformer.

15. The communication matching network of claim 8, wherein the communication circuit comprises an amplifier, or a mixer, or an oscillator.

16. The communication matching network of claim 8, wherein the harmonic trap is tuned to suppress a desired frequency, wherein the harmonic trap is tuned by varying the third inductance, or varying the capacitance, or varying both the inductance and the capacitance.

17. A method to suppress multiple harmonics in a signal in a communication system, the method comprising:

providing, by a communication circuit, the signal;

receiving, by a matching circuit, the signal;

suppressing, by the matching circuit, one or more harmonics of the received signal to generate a filtered signal, wherein the matching circuit comprises:

an impedance matching circuit having a first inductance and a second inductance, and configured to receive the signal from the communication circuit and match an impedance between an output of the communication circuit and an antenna port; and a harmonic filter configured to receive the signal from the impedance matching circuit and perform a harmonic filtering of the signal to suppress harmonics in the signal, to generate the filtered signal, wherein the harmonic filter comprises a harmonic inductance as a third inductance that is physically located inside a layout of the first inductance;

establishing an inductive coupling between the harmonic inductance and the first inductance that is below a predetermined threshold based on a minimum distance between windings of the harmonic inductance and windings of at least one of the first inductance or the second inductance being greater than a minimum distance between the windings of the first inductance and the second inductance; wherein the harmonic inductance of the harmonic filter is shaped as a substantially 8-shaped winding inside the layout of the first inductance; and and receiving, by the antenna port, the filtered signal from the matching circuit for further processing or transmission.

18. The method of claim 17, wherein the impedance matching circuit comprises a transformer comprising the first inductance as a first winding and a second inductance as a second winding, and wherein the first winding and the second winding are inductively coupled together.

19. The method of claim 18, wherein the harmonic filter comprises a harmonic trap comprising the harmonic inductance as the third inductance, and wherein the third inductance is physically located inside a layout of the first inductance or the second inductance, or both.

* * * * *